US012683616B2

(12) United States Patent
Hu et al.

(10) Patent No.: US 12,683,616 B2
(45) Date of Patent: Jul. 14, 2026

(54) CHARGE-STEERING-SAMPLING PHASE DISCRIMINATOR, DIGITAL LOOP FILTER AND CHARGE-STEERING-SAMPLING ALL DIGITAL PHASE-LOCKED LOOP THEREOF

(71) Applicant: UNIVERSITY OF SCIENCE AND TECHNOLOGY OF CHINA, Hefei (CN)

(72) Inventors: Yizhe Hu, Hefei (CN); Weichen Tao, Hefei (CN)

(73) Assignee: UNIVERSITY OF SCIENCE AND TECHNOLOGY OF CHINA, Hefei (CN)

( * ) Notice: Subject to any disclaimer, the term of this patent is extended or adjusted under 35 U.S.C. 154(b) by 9 days.

(21) Appl. No.: 18/954,581

(22) Filed: Nov. 21, 2024

(65) Prior Publication Data

US 2025/0167791 A1　May 22, 2025

(30) Foreign Application Priority Data

Nov. 22, 2023　(CN) ......................... 202311564128.6

(51) Int. Cl.
　H03L 7/197　(2006.01)
　H03L 7/093　(2006.01)
　(Continued)

(52) U.S. Cl.
　CPC ............ H03L 7/1976 (2013.01); H03L 7/093 (2013.01); H03L 7/099 (2013.01); H03M 1/466 (2013.01); H03L 2207/50 (2013.01)

(58) Field of Classification Search
　CPC ....... H03L 7/1976; H03L 7/093; H03L 7/099; H03L 2207/50; H03L 7/091; H03L 7/18;
　(Continued)

(56) References Cited

U.S. PATENT DOCUMENTS 9,762,250 B2 * 9/2017 Perrott .................. H03L 7/0995
11,569,826 B2 * 1/2023 Tang ........................ H03M 3/34
(Continued)

*Primary Examiner* — John W Poos
(74) *Attorney, Agent, or Firm* — Hemisphere Law, PLLC

(57) ABSTRACT

The present invention discloses a CSS-PD (Charge-Steering-Sampling Phase Discriminator), a DLF (Digital Loop Filter) and a CSS-ADPLL (Charge-Steering-Sampling All Digital Phase-Locked Loop) thereof The CSS-PD includes a Frac-N C-DAC, a CSS, and a SAR-ADC. The CSS-PD has a controlling method including four steps: (1) charge presetting; (2) charge-steering sampling; (3) fractional charge compensating; (4) digitalizing. Wherein when $\Delta V_{err,pn}$ sampled by the CSS included two errors $\Delta V_{err,pn}$ and $\Delta V_{err,frac}$, $\Delta V_{err,frac}$ had fractional charge compensating by setting part of the capacitors of the $C_{frac}$ of the Frac-N C-DAC to a $V_{ref,adc}$. $V_{ref,adc}$ was satisfied the following formula: $\Delta V_{err,frac}=D_{frac}\cdot C_{unit}/(C_{frac}+C_{sar})\cdot V_{ref,adc}$. $C_{unit}$ is for capacitance of $C_{frac}$, $C_{frac}$ is also for capacitance of $C_{frac}$, $C_{sar}$ is also for capacitance of $C_{sar}$ of the SAR-ADC, $D_{frac}$ is the output signal of the Frac-N C-DAC. A CSS-ADPLL with the CSS-PD can obtain the performance of low jitter, low fractional division spurious and low reference spurious at the same time.

17 Claims, 5 Drawing Sheets

(51) Int. Cl.
  *H03L 7/099*          (2006.01)
  *H03M 1/46*          (2006.01)

(58) Field of Classification Search
  CPC ....... H03L 7/085; H03L 7/0802; H03L 7/081;
    H03L 7/087; H03L 7/0995; H03L 7/0895;
    H03L 7/1974; H03L 7/0991; H03L
    7/0992; H03L 2207/06; H03L 7/0814;
    H03L 7/04; H03L 7/08; H03L 7/0816;
    H03L 7/0891; H03L 7/0898; H03L
    7/0807; H03L 7/197; H03L 7/00; H03L
    7/097; H03L 7/1072; H03L 7/187; H03L
    7/0805; H03L 7/104; H03L 7/16; H03L
    7/183; H03L 7/0998; H03L 7/0812; H03L
    7/089; H03L 7/0893; H03L 7/1978; H03L
    7/24; H03L 3/00; H03L 7/0996; H03L
    7/101; H03L 7/146; H03L 7/0994; H03L
    7/0997; H03L 7/103; H03L 7/1075; H03L
    7/185; H03L 7/193; H03L 2207/12; H03L
    7/06; H03L 7/113; H03L 7/148; H03L
    7/1806; H03L 7/23; H03M 1/466; H03M
    1/468; H03M 1/0836; H03M 1/66; H03M
    1/0854; H03M 3/358; H03M 3/368;
    H03M 7/3004; H03M 1/0626; H03M
    1/0687; H03M 1/182; H03M 3/414;
    H03M 3/50; H03M 1/002; H03M 1/0629;
    H03M 1/0631; H03M 1/0668; H03M
    1/1014; H03M 1/1033; H03M 1/1061;
    H03M 1/1255; H03M 1/662; H03M 1/68;
    H03M 1/745; H03M 1/747; H03M 3/02;
    H03M 3/462; H03M 7/3002; H03M
    7/3008; H03M 1/0665; H03M 1/12;
    H03M 1/48; H03M 1/50; H03M 1/60;
    H03M 1/804; G06F 1/12; G06F 1/022;
    G06F 1/0321; G06F 1/0353; G06F 1/00;
    H04B 1/1036; H04B 1/1027; H04B 1/04;
    H04B 3/30; H04B 1/10; H04B 10/07951;
    H04B 10/60; H04B 10/6161; H04B
    10/613; H04B 10/6162; H04B 10/6165;
    H04B 1/005; H04B 10/25073; H04B
    10/2513; H04B 10/50; H04B 10/616;
    H04B 10/697; H04B 3/04; H04B 1/40;
    H04B 1/7093; H04B 17/14; H04B
    7/0617; H04B 7/0691; H04B 7/086;
    H04B 7/0874; H03C 3/0925; H03C
    3/0941; H03C 3/095; H03C 5/00; H03C
    3/0933; H03C 3/0991; H03C 3/09; H03C
    3/0966; H03C 3/0975; H03C 3/40; H04L
    1/0003; H04L 1/0009; H04L 1/0061;
    H04L 1/203; H04L 12/2801; H04L
    2025/03808; H04L 25/03343; H04L
    27/0014; H04L 1/0045; H04L 25/03019;
    H04L 25/03057; H04L 27/2601; H04L
    27/34; H04L 41/142; H04L 5/003; H04L
    5/1446; H04L 7/0029; H04L 25/4902;
    H04L 25/085; H04L 25/0274; H04L
    25/0292; H04L 25/10; H04L 7/033; H04L
    27/2662; H04L 49/90; H04L 49/9094;
    H04L 7/0004; H04L 7/0091; H04L 12/00;
    H04L 27/148; H04L 27/18; H04L 7/0025;
    H04L 7/0331; H04L 27/00; H04L 27/12;
    H04L 27/2656; H04L 27/266; H04L
    27/2678; H04L 7/0062; H04L 25/0256;
    H04L 25/0314; H04L 25/03885; H04L
    27/2665; H04L 5/0048; H04L 2027/003;
    H04L 2027/0053; H04L 2027/0067;
    H04L 25/0204; H04L 25/024; H04L
    7/0012; H04L 7/0041; H04L 7/005; H04L
    7/0054; H04L 7/0087
  See application file for complete search history.

(56) References Cited

U.S. PATENT DOCUMENTS

| | | | |
|---|---|---|---|
| 2010/0039182 A1* | 2/2010 | Galton | H03K 23/54 |
| | | | 331/1 A |
| 2016/0226656 A1* | 8/2016 | Okada | H03L 7/22 |
| 2022/0149849 A1* | 5/2022 | Lin | H03L 7/1976 |
| 2023/0046326 A1* | 2/2023 | Hu | H03L 7/04 |

* cited by examiner $$D_{err} = 2D_{out} - (2^m - 1)$$

CHARGE-STEERING-SAMPLING PHASE DISCRIMINATOR, DIGITAL LOOP FILTER AND CHARGE-STEERING-SAMPLING ALL DIGITAL PHASE-LOCKED LOOP THEREOF

FIELD OF THE INVENTION

The present invention relates to PDs (Phase detectors), and more particularly to a Charge-Steering-Sampling Phase Discriminator, a Digital Loop Filter and a Charge-Steering-Sampling All Digital Phase-Locked Loop thereof.

BACKGROUND OF THE INVENTION

The PLL (Phase Locked Loop) chip is a kind of negative feedback control system that generates synchronous voltage by detecting the phase error between the two phase form VCO (Voltage Controlled Oscillator) and reference frequency, and then detuning VCO to generate target frequency. The PLL chip includes a PD, a AF (Analog Filter), a VCO and a FD (Fractional Divider) which is under the control of DSM (Delta-Sigma Modulator). However, due to the low phase detection gain of the PD and the fractional division scheme based on DSM, the traditional PLL produces large fractional division quantization errors, which makes it difficult to obtain low-jitter target frequency signals to meet the needs of 5G/6G communication.

In order to obtain low jitter frequency signals, the following techniques are commonly used.

The first example is the charge injection locks phase-locked loops, however, the disadvantages are as follows: 1, the feedforward path for direct phase and frequency calibration, resulting in poor reference stray; 2, the phase lock position is not clear, may be locked to the oscillator rising edge or falling edge waveform; 3. in essence, it can only be used in integer mode.

The second example is the traditional ADPLL, however, its disadvantages are as follows: 1. the sampling process causes periodic interference to the PLL output waveform, resulting in poor reference spurious; 2, need ALF (Analog Loop Filter) occupy a large chip area; 3, the phase detection range is narrow, the need for additional FLP (Frequency Locking Loop) to ensure stable work.

The third example is the bang-bang type PLL, however, its disadvantages are as follows: 1, the output is a single-bit digital, and the PLL lock speed is slow; 2, locking range of the PLL is small to easy to lose lock.

The fourth example is the fractional frequency division scheme based on time digitizer, however, its disadvantages are as follows: 1, the phase noise of the digital time converter itself worsens the phase noise of the PLL output; 2, the nonlinearity of the digital time converter itself worsens the decimal stray of the PLL; 3, the chip area is large, the sensitivity to parasitic parameters is large, affected by power ripple, the design cost is high.

SUMMARY OF THE INVENTION

The object of the present invention is to provide a CSS-PD, a DLF and a CSS-ADPLL thereof to solve the technical problems of large quantization noise, low phase discrimination gain, output signal jitter difference and spurity difference existing in the traditional ADPLL, and solve the technical problems of long locking time and narrow locking range in the bang-bang PLL, and essentially only support integer frequency division locking.

In addition, the CSS-ADPLL also solve the technical problems of high phase noise and low linearity in the fractional frequency division scheme based on digital time converter. Then the CSS-ADPLL is also a charge rudder sampling fractional frequency division full digital phase-locked loop based on capacitive digital-to-analog converter and periodic fractional frequency division error compensation in the charge domain.

It is adopted by the present invention to realize with the following technical scheme. The Charge-Steering-Sampling Phase Discriminator CSS-PD is with two input signals $V_{ref1}$ and $V_{ref2}$ and an output signal Dout, $V_{ref1}$ and $V_{ref2}$ are a pair of sinusoidal differential signals. The CSS-PD includes a Frac-N C-DAC, a CSS, and a SAR-ADC.

The Frac-N C-DAC includes a capacitors array $C_{frac}$ and a first two-way switches array correspondingly. a up-plate is defined by a connection formed of ends of one half of capacitors of the $C_{frac}$, a baseplate is defined by another connection formed of ends of the other half of capacitors of the $C_{frac}$, and the other ends of all capacitors of the $C_{frac}$ are connected with one corresponding first two-way switch respectively in order to receive a reference voltage $V_{ref,adc}$ or receive a low-level voltage $V_{SS}$. The first two-way switches array is under control of timing-control signals clk_frac.

The CSS includes two first switches $S_1$ under the control of timing-control signals clk_div about a fractional frequency, two second switches $S_2$ under the control of timing-control signals clk_css about a trigger sampling pulse, and two transistors $M_1$ and $M_2$. clk_css is activated when the falling edge of clk_div is arrived. The two bases of $M_1$ and $M_2$ receive $V_{ref1}$ and $V_{ref2}$ respectively. The two emitters of $M_1$ and $M_2$ both receive $V_{SS}$. The collector of $M_1$ is in turn connected with one first switch $S_1$ and one second switch $S_2$ in order to receive a high-level voltage $V_{DD}$, and the collector of $M_2$ is in turn connected with another first switch $S_1$ and another second switch $S_2$ in order to receive $V_{DD}$.

The SAR-ADC includes a capacitors array $C_{sar}$ and a second two-way switches array correspondingly. another up-plate is defined by a connection formed of ends of one half of capacitors of the $C_{sar}$, another baseplate is defined by another connection formed of ends of the other half of capacitors of the $C_{sar}$, and the other ends of all capacitors of the $C_{sar}$ are connected with one corresponding second two-way switch respectively in order to receive $V_{ref,adc}$ or receive $V_{SS}$. The second two-way switches array is under control of timing-control signals clk_sar. The Frac-N C-DAC is reset when the rising edge of clk_sar is arrived. The two up-plates are both connected with the collector of $M_1$, and the two baseplates are both connected with the collector of $M_2$.

wherein Dout is defined by the output signal $N_{frac}$ between the up-plate and the baseplate of the SAR-ADC; $D_{frac}$ is defined by the output signal between the up-plate and the baseplate of the Frac-N C-DAC, then is also the input signal $N_{int}$ of the SAR-ADC; the CSS-PD has a controlling method includes four steps (1)~(4).

(1) Charge Presetting

When clk_div was on the high level voltage, the two up-plates were charged to $V_{DD}$ by switching on $S_1$ under the control of clk_div, and the two baseplates were set on $V_{SS}$ by switching on the two two-way switches arrays under the control of clk_frac and clk_sar respectively.

(2) Charge-Steering Sampling

When the falling edge of clk_div was arrived and clk_css was activated, a phase difference $\Delta V_{err,pn}$ defined by the phase difference between clk_div and the two input signals $V_{ref1}$ and $V_{ref2}$ was detected by switching on $S_2$ under the control of clk_css.

(3) Fractional Charge Compensating

When $\Delta V_{err,pn}$ included two errors $\Delta V_{err,pn}$ and $\Delta V_{err,frac}$, $\Delta V_{err,pn}$ defined by PN and $\Delta V_{err,frac}$ defined by a periodic error between the two adjacent periods of $V_{ref1}$ and $V_{ref2}$, $\Delta V_{err,frac}$ had fractional charge compensating by setting part of the capacitors of the $C_{frac}$ to $V_{ref,adc}$ because that part of two-way switches of the first two-way switches array were switched on respectively under the control of clk_frac; $V_{ref,adc}$ was satisfied the following formula: $\Delta V_{err,frac} = D_{frac} \cdot C_{unit}/(C_{frac}+C_{sar}) \cdot V_{ref,adc}$; in the formula, $C_{unit}$ is for capacitance of $C_{frac}$, $C_{frac}$ is also for capacitance of $C_{frac}$, $C_{sar}$ is also for capacitance of $C_{sar}$.

(4) Digitalizing $\Delta V_{err,pn}$ was digitalized by the SAR-ADC, and Dout was output accordingly.

In the CSS-PD of the present invention, wherein $V_{ref1}$ and $V_{ref2}$ were generated by a on-chip Sinusoidal signal generator; the generator includes a off-chip high Q-value resonator and a on-chip amplifier; the same end and the reverse end of the amplifier are respectively and electrically connected to the two ends of the resonator, $V_{ref1}$ and $V_{ref2}$ are output by the two output ends of the amplifier.

In the CSS-PD of the present invention, wherein the fractional frequency is of a oscillator.

In the CSS-PD of the present invention, wherein clk_frac is defined by delaying clk_div.

In the CSS-PD of the present invention, wherein clk_sar is defined by delaying clk_frac.

The present invention further provides a Digital Loop Filter DLF. The DLF includes a proportional path $\gamma$, an integral path $\rho$, and a first accumulator. The proportional path $\gamma$ is for receiving the output signal Dout of the CSS-PD. The integral path $\rho$ is for receiving Dout, too. The first accumulator is for accumulating two output signals of $\gamma$ and $\rho$.

In the DLF of the present invention, wherein the DLF further includes a DZ front of $\rho$ to receive Dout.

In the DLF of the present invention, wherein the DLF further includes a MRE front of $\gamma$ and the DZ to receive Dout and output a signal $D_{err}$ both to $\gamma$ and the DZ.

In the DLF of the present invention, wherein $\gamma$ is a first shifter used for shifting $D_{err}$.

In the DLF of the present invention, wherein $\rho$ includes a second shifter, a second accumulator, and an integrator e. The second accumulator is used to accumulate the two output signals of the DZ and the second shifter. The second shifter is used to receive the output signal of the second accumulator. The integrator e is used to receive the output signal of the second shifter and output a signal to the first accumulator.

The present invention further provides a Charge-Steering-Sampling All Digital Phase-Locked Loop CSS-ADPLL. The CSS-ADPLL includes the CSS-PD, the DLF, a DCO, a CML2 divider, a LMS, a $\Sigma$, a third accumulator, a fourth accumulator, a DSM, and a MMDIV. The DCO is used to numberically control the output signal of the DLF. The CML2 divider is a CML fixed frequency divider used to turn the output signal of the DCO into a preliminary frequency-division signal. The LMS is used to process $D_{frac}$ and $D_{err}$ according to the Least-Mean-Square. The $\Sigma$ is used to convert an analog signal to a digital signal, the output signal of the LMS is the analog signal. The third accumulator is used to accumulate $N_{frac}$ and the output signal of the $\Sigma$. The DSM is used to modulate $N_{frac}$. The fourth accumulator is used to accumulate $N_{int}$ and two output signals of the third accumulator and the DSM. The MMDIV is used for under-clocking the preliminary frequency-division signal and the output signal of the fourth accumulator to clk_div.

Compared with the prior art, the invention has the following beneficial effects 1~3.

1. The charge rudder sampling phase discriminator has a high phase detection gain, which has a high suppression ability to the noise of the phase discriminator itself, and makes the loop have a high bandwidth to suppress the phase noise of the numerical control oscillator (DCO). The reference signal in charge rudder is well isolated from the oscillator frequency dividing signal, which can effectively suppress the reference spurious.

2. The fractional frequency division scheme uses charge rudder and capacitive digital-to-analog converter (FRAC-N CDAC) scheme, which has the characteristics of low noise and high linearity, so that the all-digital PLL architecture has the advantages of low phase noise and low decimal stray-fraction. In addition, the scheme has the advantages of compact structure, small area and low power consumption.

3. The charge rudder digital phase discriminator has multi-bit digital phase output, which effectively improves the locking speed and locking range of all digital PLL.

DETAILED DESCRIPTION OF PREFERRED EMBODIMENTS

The present invention will now be described more specifically with reference to the following embodiments. It is to be noted that the following descriptions of preferred embodiments of this invention are presented herein for illustration and description only. It is not intended to be exhaustive or to be limited to the precise disclosed form.

The First Embodiment

Figures 1, 2:
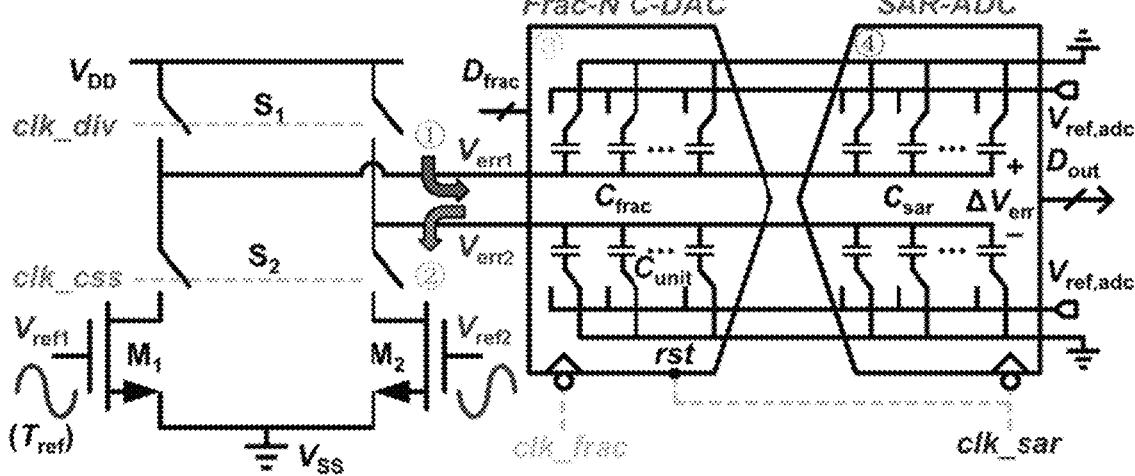
FIG. 1 is a circuit diagram of a CSS-PD for fractional dividing according to the first embodiment of the present invention.
FIG. 2 is a sequence diagram for the CSS-PD of FIG. 1.

Referring to FIG. 1, FIG. 1 is a circuit diagram of a CSS-PD (Charge-Steering-Sampling Phase Discriminator) for fractional dividing. The CSS-PD includes a CSS (Charge-Steering-Sampling), a Frac-N C-DAC (Fractional-Number Capacitive-DAC (Digital to Analog Converter)), and a SAR-ADC (SAR (Successive Approximation Register)-ADC (Analog to Digital Converter)).

The Frac-N C-DAC includes a capacitors array $C_{frac}$ and a first two-way switches array correspondingly. So the number of the capacitors in $C_{frac}$ is equal to the number of the first two-way switches in the first two-way switches array.

A up-plate is defined by a connection formed of ends of one half of capacitors of the $C_{frac}$, a baseplate is defined by another connection formed of ends of the other half of capacitors of the $C_{frac}$, and the other ends of all capacitors of the $C_{frac}$ are respectively connected with one corresponding first two-way switch in order to receive a reference voltage $V_{ref,adc}$ or receive a low-level voltage $V_{SS}$. The first two-way switches array are under control of timing-control signals clk_frac.

The CSS includes two first switches $S_1$, two second switches $S_2$ and two transistors $M_1$ and $M_2$. The two bases of $M_1$ and $M_2$ receive a pair of sinusoidal differential signals $V_{ref1}$ and $V_{ref2}$ respectively. The two emitters of $M_1$ and $M_2$ both receive a low-level voltage $V_{SS}$. The collector of $M_1$ is in turn connected with one first switch $S_1$ and one second switch $S_2$ in order to receive a high-level voltage $V_{DD}$. The collector of $M_2$ is in turn connected with another first switch $S_1$ and another second switch $S_2$ in order to receive $V_{DD}$.

The SAR-ADC includes a capacitors array $C_{sar}$ and a second two-way switches array correspondingly. So the number of the capacitors in $C_{sar}$ is equal to the number of the second two-way switches in the second two-way switches array.

Another up-plate is defined by a connection formed of ends of one half of capacitors of the $C_{sar}$, another baseplate is defined by another connection formed of ends of the other half of capacitors of the $C_{sar}$, and the other ends of all capacitors of the $C_{sar}$ are connected with one corresponding second two-way switch respectively in order to receive $V_{ref,adc}$ or receive $V_{SS}$. The two up-plates are both connected with the collector of $M_1$, and the two baseplates are both connected with the collector of $M_2$.

Further referring to FIG. 2, the first two-way switches array is under control of timing-control signals clk_frac. The second two-way switches array is under control of timing-control signals clk_sar. The two first switches $S_1$ are under the control of timing-control signals clk_div about a fractional frequency could be of a oscillator. The two second switches $S_2$ are under the control of timing-control signals clk_css about a trigger sampling pulse. clk_css is activated when the falling edge of clk_div is arrived. clk_frac is defined by delaying clk_div. clk_sar is defined by delaying clk_frac. The Frac-N C-DAC is reset when the rising edge of clk_sar is arrived.

$V_{ref1}$ and $V_{ref2}$ can be generated by a on-chip Sinusoidal signal generator. The generator can include a off-chip high Q-value resonator and a on-chip amplifier. The same end and the reverse end of the amplifier are respectively and electrically connected to the two ends of the resonator. $V_{ref1}$ and $V_{ref2}$ are output by the two output ends of the amplifier.

Figure 3:
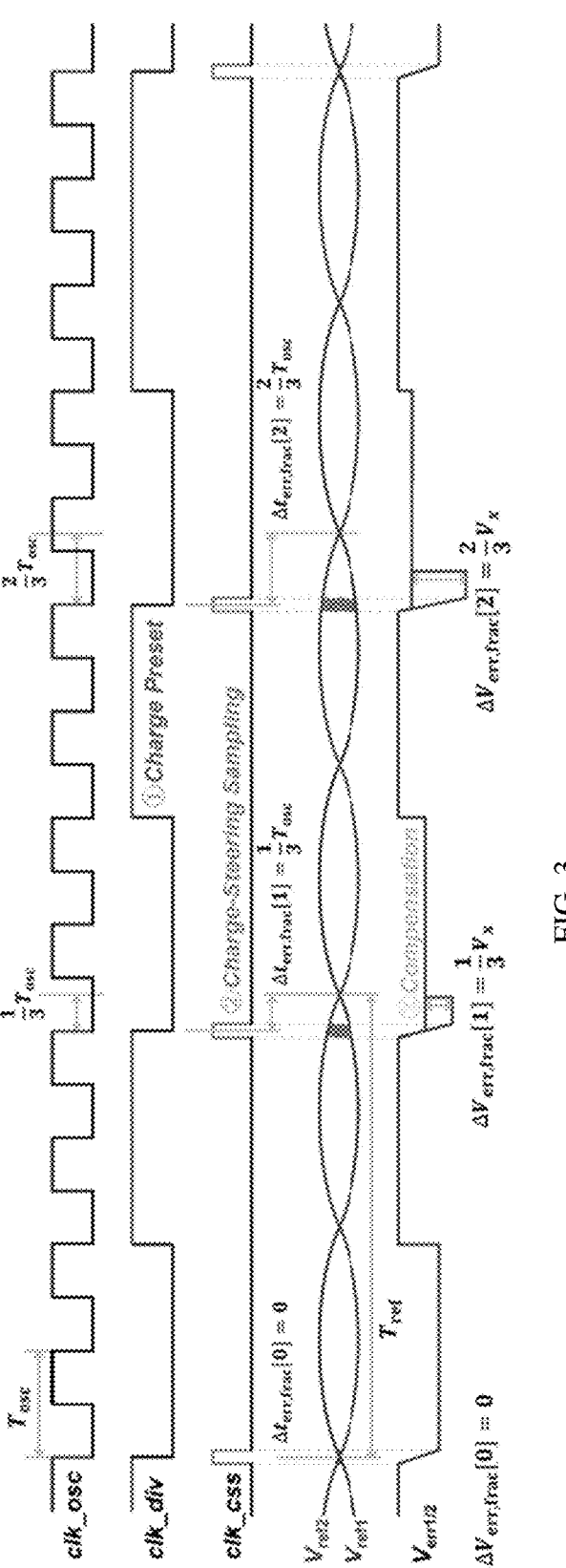
FIG. 3 is an effect diagram of the CSS-PD of FIG. 1 according to the sequence diagram of FIG. 2.

Further referring to FIG. 3, Dout is defined by the output signal $N_{frac}$ between the up-plate and the baseplate of the SAR-ADC. $D_{frac}$ is defined by the output signal between the up-plate and the baseplate of the Frac-N C-DAC, then is also the input signal $N_{int}$ of the SAR-ADC. The CSS-PD has a controlling method includes four steps (1)~(4).

(1) Charge Presetting

When clk_div was on the high level voltage, the two up-plates were charged to $V_{DD}$ by switching on $S_1$ under the control of clk_div, and the two baseplates were set on $V_{SS}$ by switching on the two two-way switches arraies under the control of clk_frac and clk_sar respectively.

(2) Charge-Steering Sampling

Figure 4:
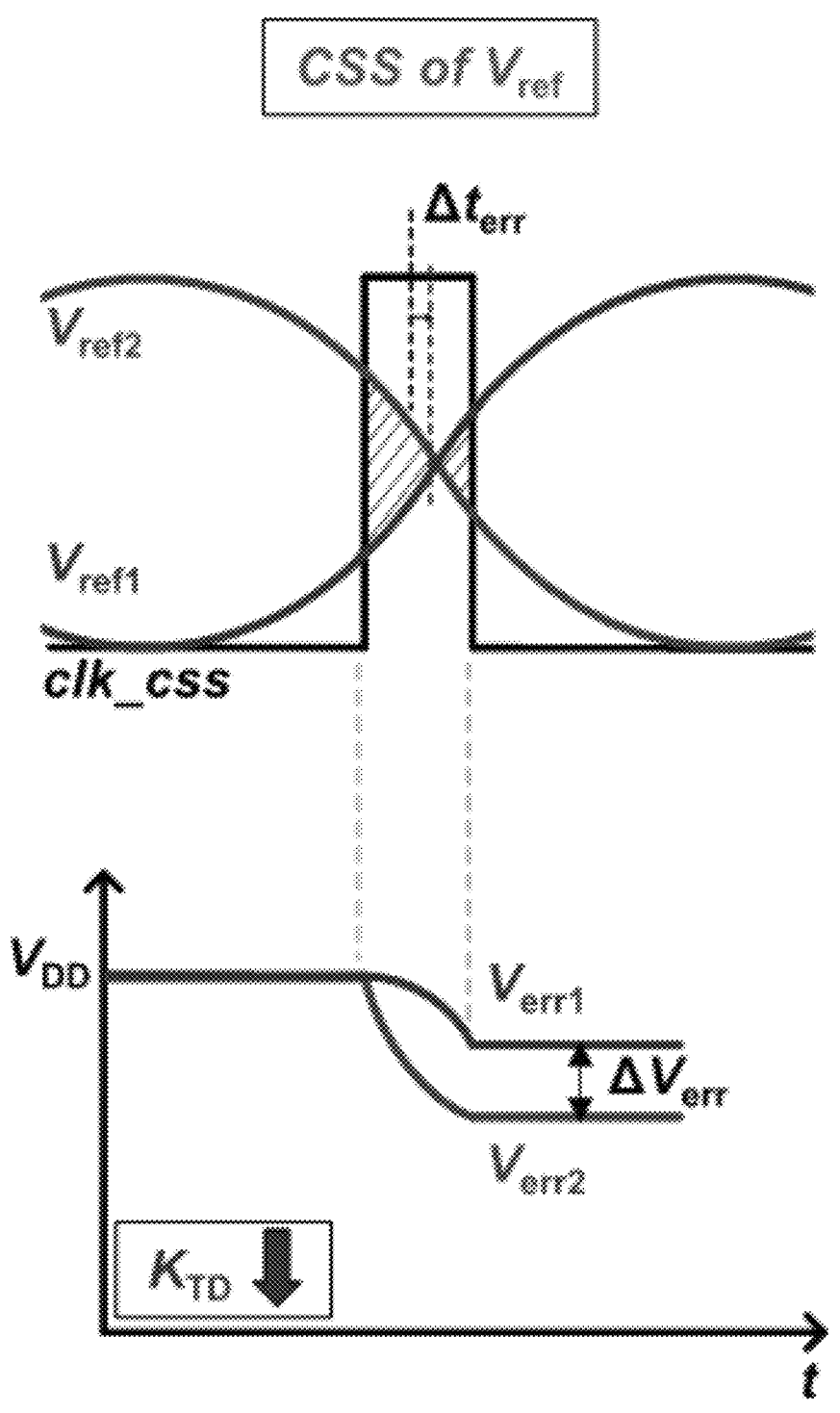
FIG. 4 is a schematic diagram of the CSS-PD of FIG. 1.

Further referring to FIG. 4, when the falling edge of clk_div was arrived and clk_css was activated, a phase difference $\Delta V_{err,pn}$ ($\Delta V_{err,pn}$ is also $\Delta t_{err,pn}$) defined by the phase difference between clk_div and the two input signals $V_{ref1}$ and $V_{ref2}$ was detected by switching on $S_2$ under the control of clk_css.

During the process of charge-steering sampling, the differential charge of the $C_{frac}$ and $C_{sar}$ was discharged. The net discharge of the $M_1$ and $M_2$ depended on the overlap area of clk_css and $V_{ref1}$-$V_{ref2}$. The overlap areas was shown in FIG. 4, such as the right shadow area and the left shadow area. The phase error $\Delta t_{err}$ could be represented by Differential residual charge $\Delta V_{err}$ between $C_{frac}$ and $C_{sar}$.

(3) Fractional Charge Compensating

When $\Delta V_{err,pn}$ included two errors $\Delta V_{err,pn}$ ($\Delta V_{err,pn}$ is also $\Delta t_{err,frac}$) and $\Delta V_{err,frac}$, $\Delta V_{err,pn}$ defined by PN and $\Delta V_{err}$, frac defined by a periodic error between the two adjacent periods of $V_{ref1}$ and $V_{ref2}$, $\Delta V_{err,frac}$ had fractional charge compensating by setting part of the capacitors of the $C_{frac}$ to $V_{ref,adc}$ because that part of two-way switches of the first two-way switches array were switched on respectively under the control of clk_frac. $V_{ref,adc}$ was satisfied the following formula: $\Delta V_{err,frac}=D_{frac} \cdot C_{unit}/(C_{frac}+C_{sar}) \cdot V_{ref,adc}$. In the formula, $C_{unit}$ is for capacitance of $C_{frac}$, $C_{frac}$ is also for capacitance of $C_{frac}$, $C_{sar}$ is also for capacitance of $C_{sar}$.

The FIGS. 3 and 4 are shown the mechanism of production for why $\Delta V_{err}$, frac is appeared, as an example of $T_{ref}=(4+\frac{1}{3}) T_{osc}$, under the condition that all phase noise and static phase errors are ignored. Compared with the traditional Bang-Bang type PLL, the SAR-ADC of the present invention has the advantages of multi-bit output, fast locking speed, large locking range, and so on.

(4) Digitalizing $\Delta V_{err,pn}$ was digitalized by the SAR-ADC, and Dout was output accordingly.

The CSS-PD in the present embodiment had a high phase detection gain, and a very high ability to suppress the noise of the phase discriminator itself. The CSS-PD in the present embodiment further makes the loop have a high bandwidth to suppress the phase noise of DCO. The reference signal in charge rudder was well isolated from the oscillator, which could effectively suppress the reference spurious.

The Second Embodiment

Figure 5:
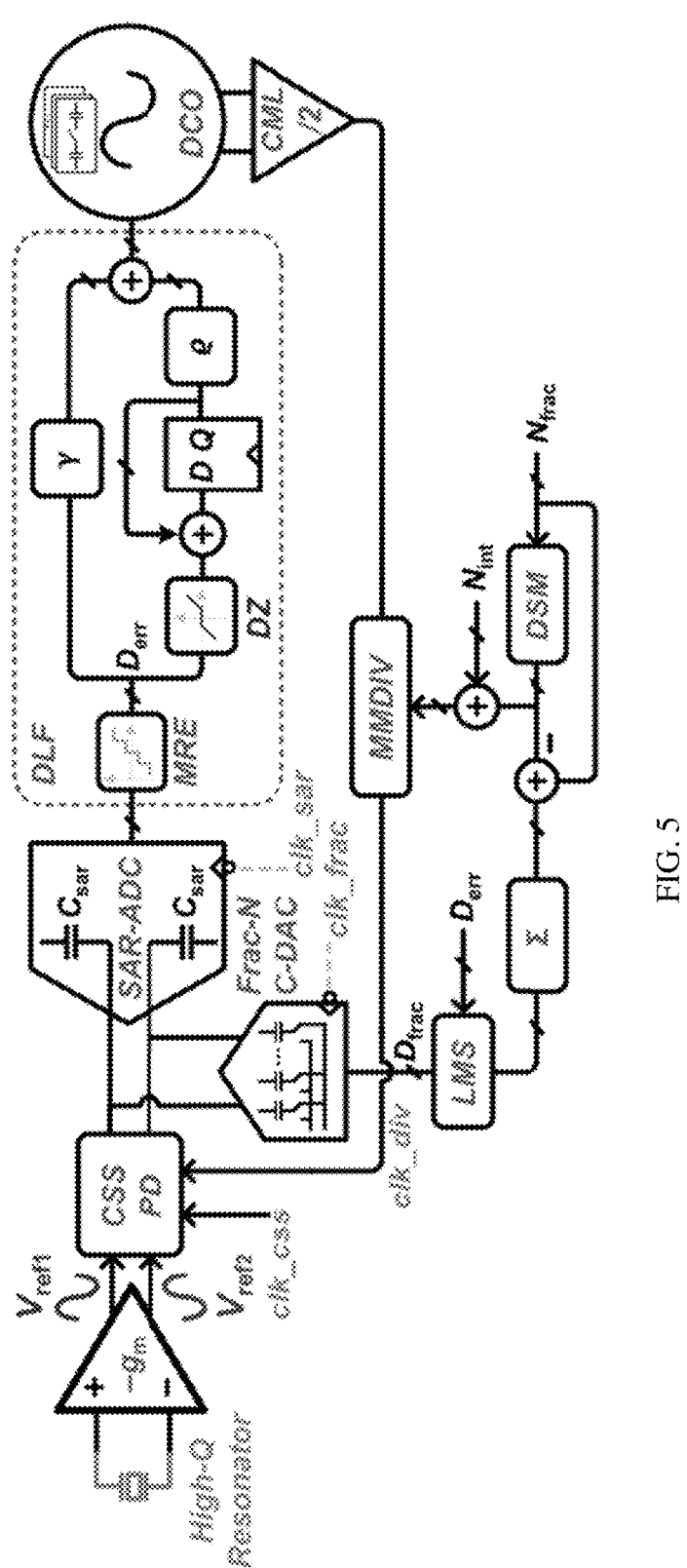
FIG. 5 is a functional diagram of a CSS-ADPLL according to the second embodiment of the present invention, the CSS-ADPLL includes a DLF and the CSS-PD of FIG. 1.

Please referring to FIG. 5, a functional diagram of a CSS-ADPLL according to the second embodiment of the present invention is shown. The CSS-ADPLL includes a DLF and the CSS-PD of FIG. 1.

The DLF includes a proportional path γ, an integral path ρ, and a first accumulator. The DLF can further include a DZ (Dead Zone), even include a MRE.

If the DLF only includes the proportional path γ, the integral path ρ, and the first accumulator. The proportional path γ is used for receiving the output signal Dout of the CSS-PD according to the first embodiment. The integral path ρ is used for receiving Dout, too. The first accumulator, is used for accumulating two output signals of γ and ρ. If the DLF further include the DZ. The DZ is front of ρ to receive Dout. If the DLF further include the MRE. The MRE is front of γ and the DZ to receive Dout and output a signal $D_{err}$ both to γ and the DZ. γ can be a first shifter used for shifting $D_{err}$. ρ can include a second shifter, a second accumulator, and an integrator e. The second accumulator is used to accumulate the two output signals of the DZ and the second shifter. The second shifter is used to receive the output signal of the second accumulator. The integrator e is used to receive the output signal of the second shifter and output a signal to the first accumulator.

In the present embodiment, the CSS-ADPLL includes the CSS-PD of the first embodiment, the DLF (Digital Loop Filter), a DCO (Digital-Controlled Oscillator), a LMS

7

8

(Least-Mean-Square), a $\Sigma$ (delta-sigma modulator), a third accumulator, a DSM (Digital Signal Modulator), a fourth accumulator, a CML2 divider, and a MMDIV (Multi-Modulus Divider).

The feedforward path of the CSS-ADPLL includes the CSS, the Frac-N C-DAC, the SAR-ADC, the MRE, the DLF, and the DCO.

The DLF is used to digital filter Dout of the CSS-PD. Since there is a controllable DZ at the front of the integral path $\rho$, $\rho$ can be invalidated after phase locking to avoid the conflict between the two control paths. This can greatly improve the clock jitter performance of the CSS-ADPLL. The output of the DLF directly controls the capacitor switch array of the DCO, changes the oscillation frequency of the DCO and realizes the phase calibration of the DCO output signal by changing the capacitance value of the incoming the DCO.

The CML2 divider is a CML fixed frequency divider used to turn the output signal of the DCO into a preliminary frequency-division signal. The output frequency signal of the DCO is passed through the CML2 divider and the MMDIV to obtain clk_div. That is, the target frequency signal output by the CNC oscillator is converted into a preliminary frequency division signal through the current mode fixed frequency divider (into the operating frequency range of the multi-mode divider), and the multi-mode divider converts the preliminary frequency division signal into the frequency division signal clk_div under the control of the delta-sigma modulator signal. The feedback path of PLL includes CML2 divider and MMDIV, which is controlled by delta-sigma controller to realize fractional divider function. At the same time, the detection error $D_{err}$ is used to calibrate the gain of C-DAC by LMS algorithm to reduce the decimal stray.

Figure 6:
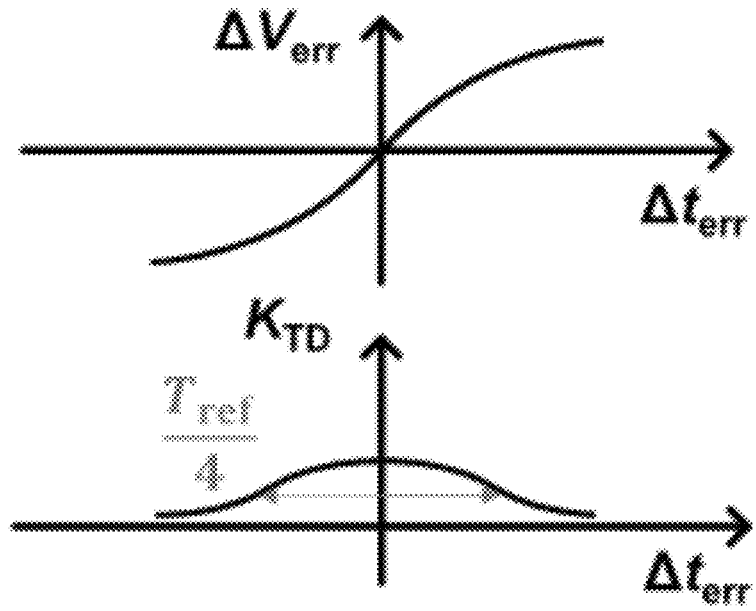
FIG. 6 is a schematic diagram of the CSS-ADPLL of FIG. 5.
Figure 6:
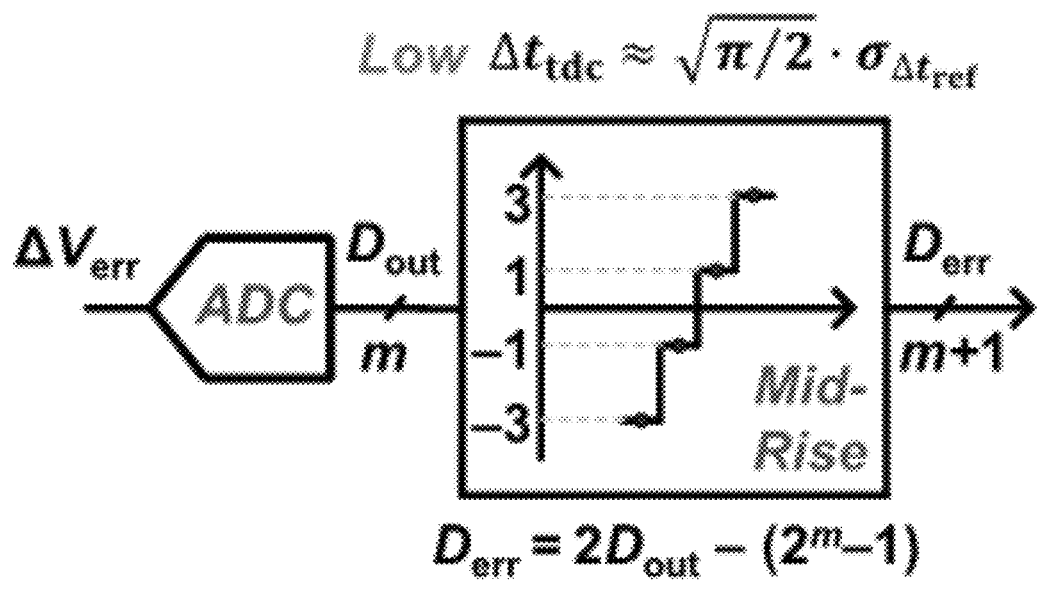

In the FIG. 6, a voltage change between $V_{ref1}$ and $V_{ref2}$ is shown when clk_css samples $V_{ref1}$ and $V_{ref2}$. The charge rudder sampling operation of the invention has a wide linear phase detection range, up to $T_{ref}/4$, compared with the traditional subsampled PLL. Thus, when the range of the periodic decimal phase detection error $\Delta t_{err,frac}$ approaches the maximum$+/-$Tosc, which is presented in the CSS-PD linear working area. C-DAC can be linearly compensated to obtain superior fractional stray performance. However, due to the low slope of the reference signal, the phase detection gain of the charge rudder sampling reference signal is small. Therefore, we propose to use the intermediate lift encoder (MRE) to recode the results of the SAR-ADC output, so that the phase detection gain depends not on the slope of the reference signal but on the clock jitter of the reference signal. The phase detection gain is greatly improved, as shown in the upper right area of FIG. 6.

The fractional frequency division scheme in this embodiment uses a charge rudder and a digital-to-analog converter scheme, which has the characteristics of low noise and high linearity, thus making the all-digital PLL architecture have the advantages of low phase noise and low spurity. In addition, the scheme has the advantages of compact structure, small area and low power consumption.

In the present embodiment, sinusoidal differential reference signals $V_{ref1}$ and $V_{ref2}$ can be generated by a sinusoidal differential reference signal generator, which comprises a high Q-value resonator and an on-chip amplifying circuit ($-gm$), and the same and reverse ends of the on-chip amplifying circuit ($-gm$) are electrically connected to both ends of the high Q-value resonator, respectively. The sinusoidal differential reference signals $V_{ref1}$ and $V_{ref2}$ are output from the two outputs of the on-chip amplifier circuit ($-gm$).

The standard reference signal Vref is generated by a high Q-value resonator and an on-chip amplification circuit ($-gm$), which enables the Vref to have extremely low phase noise levels, and the reference signal noise is not limited to the input buffer.

Therefore, in this embodiment, two experimental examples are taken as examples to explain in detail.

(1) When the frequency of the $V_{ref1}$ and $V_{ref2}$ is 250 MHz, $N_{frac}$=0, the frequency dividing ratio of the MMDIV is 48, combined the CML2 divider, the total frequency ratio is 96 and the output frequency of the DCO is locked at 24 GHz. At this time, the Frac-N C-DAC and the LMS are not working, their control word $D_{frac}$ remains 0, and the phase error detected by the CSS only includes the phase error caused by loop phase noise. Set the proportional path of the DLF $\gamma$=1, and after locking, shift the dead zone size to the right two bits to disable the integral path, and the control word of the DCO will jump between the two digits to achieve PLL locking.

(2) When the frequency of the $V_{ref1}$ and $V_{ref2}$ is 250 MHz, $N_{frac}$=⅓, $N_{int}$ is 48, DSM is rank 1. At this time, the frequency division ratio of MMDIV is periodically set to 48, 48, 49, combined with the CML2 divider, the total frequency ratio is periodically set to 96, 96, 98, and the output frequency of the the DCO is locked at 24.167 GHz. The Frac-N C-DAC will periodically compensate for the charge error corresponding to ⅓ $T_{osc}$, ⅔$_{Tosc}$, 0. The output $D_{err}$ of the MRE will be used to calibrate the compensation gain of the Frac-N C-DAC by the LMS algorithm. Set the proportional path of the DLF $\gamma$=1, and after locking, shift the size of the DZ to the right two bits to disable the integral path $\rho$, and the control word of the DCO will jump between the two digits to achieve PLL locking.

Combining the two embodiments, it can be seen that the invention has the following advantages 1~3.

1. The CSS-PD is a multi-bit output digital phase discriminator as composed of charge domain fusion with the the technology of charge steering sampling and a new Frac-N C-DAC, The multi-bit output digital phase discriminator composed of charge domain fusion of charge rudder sampling technology and Frac-N C-DAC proposed in this project has high phase detection gain, extremely high suppression ability to the noise of phase discriminator itself, and makes the loop have high bandwidth to suppress the phase noise of the DCO. In addition, compared with the subsampled PLL, the reference signal in charge rudder is better isolated from the oscillator, which can effectively suppress the reference stray.

2. The fractional frequency division scheme uses the CSS and the SAR-ADC. Compared with the scheme based on digital time converter, this scheme has the characteristics of low noise and high linearity, so that the all-digital PLL architecture has the advantages of low phase noise and low spurity. In addition, the scheme has the advantages of compact structure, small area and low power consumption. Among them, the capacitors in the CSS-PD and the SAR-ADC can directly reuse the Frac-N C-DAC.

3. The invention can effectively improve the locking speed and locking range of the CSS-ADPLL through multi-bit digital phase output of the charge rudder digital phase discriminator. This effectively overcomes the long locking time of PLL based on bang-bang phase discriminator (that is, 1-bit digital phase output).

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A Charge-Steering-Sampling Phase Discriminator (CSS-PD), with two input signals ($V_{ref1}$) and ($V_{ref2}$) and an output signal (Dout), input signals ($V_{ref1}$) and ($V_{ref2}$) being a pair of sinusoidal differential signals, the CSS-PD comprises:

a Frac-N C-DAC, comprising a capacitors array ($C_{frac}$) and a first two-way switches array correspondingly; a up-plate defined by a connection formed of ends of one half of capacitors of the capacitors array ($C_{frac}$), a baseplate defined by another connection formed of ends of the other half of capacitors of the capacitors array ($C_{frac}$), and the other ends of all capacitors of the capacitors array ($C_{frac}$) connected with one corresponding first two-way switch respectively in order to receive a reference voltage ($V_{ref,adc}$) or receive a low-level voltage ($V_{SS}$); the first two-way switches array under control of timing-control signals (clk_frac);

a CSS, comprising two first switches ($S_1$) under the control of timing-control signals (clk_div) about a fractional frequency, two second switches ($S_2$) under the control of timing-control signals (clk_css) about a trigger sampling pulse, and two transistors ($M_1$) and ($M_2$); timing-control signals (clk_css) activated when the falling edge of timing-control signals (clk_div) arrived; the two bases of transistors ($M_1$) and ($M_2$) receiving input signals ($V_{ref1}$) and ($V_{ref2}$) respectively; the two emitters of transistors ($M_1$) and ($M_2$) both receiving low-level voltage ($V_{SS}$); the collector of transistor ($M_1$) in turn connected with one first switch ($S_1$) and one second switch ($S_2$) in order to receive a high-level voltage $V_{DD}$), and the collector of transistor ($M_2$) in turn connected with another first switch ($S_1$) and another second switch ($S_2$) in order to receive high-level voltage ($V_{DD}$);

a SAR-ADC, comprising a capacitors array ($C_{sar}$) and a second two-way switches array correspondingly; another up-plate defined by a connection formed of ends of one half of capacitors of the capacitors array ($C_{sar}$), another baseplate defined by another connection formed of ends of the other half of capacitors of the capacitors array ($C_{sar}$), and the other ends of all capacitors of the capacitors array ($C_{sar}$) connected with one corresponding second two-way switch respectively in order to receive reference voltage ($V_{ref,adc}$) or receive low-level voltage ($V_{SS}$); the second two-way switches array under control of timing-control signals (clk_sar); the Frac-N C-DAC reset when the rising edge of the timing-control signal (clk_sar) arrived; the two up-plates both connected with the collector of transistor ($M_1$), and the two baseplates both connected with the collector of transistor ($M_2$);

wherein output signal (Dout) is defined by the output signal ($N_{frac}$) between the up-plate and the baseplate of the SAR-ADC; signal ($D_{frac}$) is defined by the output signal between the up-plate and the baseplate of the Frac-N C-DAC, then is also the input signal ($N_{int}$) of the SAR-ADC; the CSS-PD has a controlling method comprising:

(1) charge presetting when timing-control signals (clk_div) was on the high level voltage, the two up-plates were charged to high-level voltage ($V_{DD}$) by switching on $S_1$ under the control of timing-control signals (clk_div), and the two baseplates were set on low-level voltage ($V_{SS}$) by switching on the two two-way switches arrays under the control of timing-control signals (clk_frac) and timing-control signals (clk_sar) respectively;

(2) charge-steering sampling when the falling edge of timing-control signals (clk_div) was arrived and timing-control signals (clk_css) was activated, a phase difference ($\Delta V_{err,pn}$) defined by the phase difference between timing-control signals (clk_div) and the two input signals ($V_{ref1}$) and ($V_{ref2}$) was detected by switching on the second switch ($S_2$) under the control of timing-control signals (clk_css);

(3) fractional charge compensating when phase difference ($\Delta V_{err,pn}$) included two errors ($\Delta V_{err,pn}$) and $\Delta V_{err,frac}$, error ($\Delta V_{err,pn}$) defined by PN and error ($\Delta V_{err,frac}$) defined by a periodic error between the two adjacent periods of input signals ($V_{ref1}$) and ($V_{ref2}$), error ($\Delta V_{err,frac}$) had fractional charge compensating by setting part of the capacitors of the capacitors array ($C_{frac}$) to reference voltage ($V_{ref,adc}$) because that part of two-way switches of the first two-way switches array were switched on respectively under the control of timing-control signals (clk_frac); reference voltage ($V_{ref,adc}$) was satisfied the following formula: $\Delta V_{err,frac} = D_{frac} \cdot C_{unit}/(C_{frac}+C_{sar}) \cdot V_{ref,adc}$; in the formula, $C_{unit}$ is for capacitance of capacitors array ($C_{frac}$), $C_{frac}$ is also for capacitance of capacitors array ($C_{frac}$), $C_{sar}$ is also for capacitance of capacitors array ($C_{sar}$);

(4) digitalizing phase difference ($\Delta V_{err,pn}$) was digitalized by the SAR-ADC, and the output signal (Dout) was output accordingly.

2. The CSS-PD according to claim 1, wherein input signals ($V_{ref1}$) and ($V_{ref2}$) were generated by a on-chip Sinusoidal signal generator; the generator includes a off-chip high Q-value resonator and a on-chip amplifier; a same end and a reverse end of the amplifier are respectively and electrically connected to the two ends of the resonator, input signals ($V_{ref1}$) and ($V_{ref2}$) are output by the two output ends of the amplifier.

3. The CSS-PD according to claim 1, wherein the fractional frequency is generated by an oscillator.

4. The CSS-PD according to claim 3, wherein timing-control signals (clk_frac) is defined by delaying timing-control signals (clk_div).

5. The CSS-PD according to claim 4, wherein timing-control signals (clk_sar) is defined by delaying timing-control signals (clk_frac).

6. A Digital Loop Filter DLF, comprises:

a proportional path ($\gamma$), for receiving the output signal (Dout) of the CSS-PD according to claim 1;

an integral path ($\rho$), for receiving output signal (Dout), too;

a first accumulator, for accumulating two output signals of ($\gamma$) and ($\rho$).

7. The DLF according to claim 6, further comprises:

a DZ, front of $\rho$ to receive output signal (Dout).

8. The DLF according to claim 7, further comprises:

a MRE, front of ($\gamma$) and the DZ to receive output signal (Dout) and output a signal ($D_{err}$) both to ($\gamma$) and the DZ.

9. The DLF according to claim 8, wherein ($\gamma$) is a first shifter used for shifting signal ($D_{err}$).

10. The DLF according to claim 9, wherein (ρ) comprises:

a second shifter;

a second accumulator, used to accumulate the two output signals of the DZ and the second shifter; the second shifter used to receive the output signal of the second accumulator;

an integrator e, used to receive the output signal of the second shifter and output a signal to the first accumulator.

11. A Charge-Steering-Sampling All Digital Phase-Locked Loop CSS-ADPLL, comprises:

the CSS-PD, according to claim 1;

a DLF, used to digital filter (Dout) of the CSS-PD, the DLF comprises:

a proportional path (γ), for receiving the output signal (Dout) of the CSS-PD;

an integral path (ρ), for receiving the output signal (Dout), too;

a first accumulator, for accumulating two output signals of (γ) and (ρ);

a DZ, front of ρ to receive digital filter (Dout); and a MRE, front of (γ) and the DZ to receive the output signal (Dout) and output a signal ($D_{err}$) both to (γ) and the DZ;

a DCO, used to numerically control the output signal of the DLF;

a CML2 divider, being a CML fixed frequency divider used to turn the output signal of the DCO into a preliminary frequency-division signal;

a LMS, used to process signal ($D_{frac}$) and signal ($D_{err}$) according to the Least-Mean-Square;

a Σ, used to convert an analog signal to a digital signal, the output signal of the LMS being the analog signal;

a third accumulator, used to accumulate output signal ($N_{frac}$) and the output signal of the Σ;

a DSM, used to modulate output signal ($N_{frac}$);

a fourth accumulator, used to accumulate input signal ($N_{int}$) and two output signals of the third accumulator and the DSM;

a MMDIV, used for underclocking the preliminary frequency-division signal and the output signal of the fourth accumulator to timing-control signals (clk_div).

12. The CSS-ADPLL according to claim 11, wherein input signals ($V_{ref1}$) and ($V_{ref2}$) were generated by a on-chip Sinusoidal signal generator; the generator includes a off-chip high Q-value resonator and a on-chip amplifier; a same end and a reverse end of the amplifier are respectively and electrically connected to the two ends of the resonator, input signals ($V_{ref1}$) and ($V_{ref2}$) are output by the two output ends of the amplifier.

13. The CSS-ADPLL according to claim 11, wherein the fractional frequency is generated by an o oscillator.

14. The CSS-ADPLL according to claim 13, wherein timing-control signals (clk_frac) is defined by delaying timing-control signals (clk_div).

15. The CSS-ADPLL according to claim 14, wherein timing-control signals (clk_sar) is defined by delaying timing-control signals (clk_frac).

16. The CSS-ADPLL according to claim 11, wherein (γ) is a first shifter used for shifting signal ($D_{err}$).

17. The CSS-ADPLL according to claim 11, wherein (ρ) comprises:

a second shifter;

a second accumulator, used to accumulate the two output signals of the DZ and the second shifter; the second shifter used to receive the output signal of the second accumulator;

an integrator e, used to receive the output signal of the second shifter and output a signal to the first accumulator.

* * * * *